(12) United States Patent
Wu et al.

(10) Patent No.: US 11,302,734 B2
(45) Date of Patent: Apr. 12, 2022

(54) DEEP TRENCH ISOLATION STRUCTURES RESISTANT TO CRACKING

(71) Applicant: Taiwan Semiconductor Manufacturing Company, Ltd., Hsinchu (TW)

(72) Inventors: Ming-Chi Wu, Kaohsiung (TW); Chun-Chieh Fang, Chiayi (TW); Bo-Chang Su, Tainan (TW); Chien Nan Tu, Kaohsiung (TW); Yu-Lung Yeh, Kaohsiung (TW); Kun-Yu Lin, Tainan (TW); Shih-Shiung Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 6 days.

(21) Appl. No.: 16/120,629

(22) Filed: Sep. 4, 2018

(65) Prior Publication Data
US 2020/0006410 A1 Jan. 2, 2020

Related U.S. Application Data

(60) Provisional application No. 62/691,926, filed on Jun. 29, 2018.

(51) Int. Cl.
*H01L 27/146* (2006.01)
*H01L 21/762* (2006.01)
(Continued)

(52) U.S. Cl.
CPC .... *H01L 27/1463* (2013.01); *H01L 21/32051* (2013.01); *H01L 21/76224* (2013.01); *H01L 27/14629* (2013.01); *H01L 21/3065* (2013.01); *H01L 21/31111* (2013.01); *H01L 21/31116* (2013.01); *H01L 27/14621* (2013.01); *H01L 27/14627* (2013.01)

(58) Field of Classification Search
CPC ....... H01L 29/66795; H01L 21/823821; H01L 29/0649; H01L 29/66545; H01L 21/764
See application file for complete search history.

(56) References Cited

U.S. PATENT DOCUMENTS 8,558,391 B2 10/2013 Koide et al.
9,278,570 B2 3/2016 Yabe et al.
(Continued)

FOREIGN PATENT DOCUMENTS

CN 101510536 A 8/2009
CN 104303302 A 1/2015
(Continued)

*Primary Examiner* — Marcos D. Pizarro
*Assistant Examiner* — Quinton A Brasfield
(74) *Attorney, Agent, or Firm* — Slater Matsil, LLP

(57) ABSTRACT

A method includes etching a semiconductor substrate to form a trench, filling a dielectric layer into the trench, with a void being formed in the trench and between opposite portions of the dielectric layer, etching the dielectric layer to reveal the void, forming a diffusion barrier layer on the dielectric layer, and forming a high-reflectivity metal layer on the diffusion barrier layer. The high-reflectivity metal layer has a portion extending into the trench. A remaining portion of the void is enclosed by the high-reflectivity metal layer.

20 Claims, 18 Drawing Sheets

(51) Int. Cl.
*H01L 21/3205* (2006.01)
*H01L 21/311* (2006.01)
*H01L 21/3065* (2006.01)

(56) References Cited

U.S. PATENT DOCUMENTS

| | | | |
|---|---|---|---|
| 9,559,134 B2 | 1/2017 | Yang et al. | |
| 9,754,993 B2 * | 9/2017 | Chou | H01L 21/76229 |
| 10,026,772 B2 | 7/2018 | Shinohara | |
| 10,096,637 B2 | 10/2018 | Chung et al. | |
| 10,157,946 B2 | 12/2018 | Tu et al. | |
| 10,741,601 B2 | 8/2020 | Huang et al. | |
| 2011/0175205 A1 * | 7/2011 | Morii | H01L 21/76283 257/618 |
| 2012/0153128 A1 * | 6/2012 | Roy | H01L 27/14689 250/208.1 |
| 2013/0001772 A1 * | 1/2013 | Koide | H01L 23/522 257/737 |
| 2013/0285181 A1 * | 10/2013 | Lin | H01L 27/1463 257/432 |
| 2013/0307040 A1 * | 11/2013 | Ahn | H01L 27/1463 257/292 |
| 2015/0077524 A1 | 3/2015 | Suzuki | |
| 2015/0279885 A1 * | 10/2015 | Tu | H01L 27/14683 257/432 |
| 2016/0086985 A1 * | 3/2016 | Chung | H01L 27/1463 257/432 |
| 2016/0172391 A1 | 6/2016 | Ihara | |
| 2017/0047373 A1 | 2/2017 | Peng et al. | |
| 2017/0133414 A1 * | 5/2017 | Chiang | H01L 27/14627 |
| 2017/0236864 A1 | 8/2017 | Huang et al. | |
| 2018/0158852 A1 | 6/2018 | Sato | |

FOREIGN PATENT DOCUMENTS

| | | |
|---|---|---|
| CN | 104952892 A | 9/2015 |
| CN | 106057836 A | 10/2016 |
| CN | 106972036 A | 7/2017 |
| JP | 2009194144 A | 8/2009 |
| KR | 20160034712 A | 3/2016 |
| TW | 201208053 A | 2/2012 |
| TW | 201709503 A | 3/2017 |

* cited by examiner

DEEP TRENCH ISOLATION STRUCTURES RESISTANT TO CRACKING

PRIORITY CLAIM AND CROSS-REFERENCE

This application claims the benefit of the following provisionally filed U.S. patent application: Application Ser. No. 62/691,926, filed Jun. 29, 2018, and entitled "Deep Trench Isolation Structures Resistant to Cracking," which application is hereby incorporated herein by reference.

BACKGROUND

Semiconductor image sensors are operated to sense light. Typically, the semiconductor image sensors include Complementary Metal-Oxide-Semiconductor (CMOS) Image Sensors (CIS) and Charge-Coupled Device (CCD) sensors, which are widely used in various applications such as Digital Still Camera (DSC), mobile phone camera, Digital Video (DV) and Digital Video Recorder (DVR) applications. These semiconductor image sensors utilize an array of image sensor elements, with each image sensor element including a photodiode and other elements, to absorb light and convert the sensed light into digital data or electrical signals.

Front Side Illumination (FSI) CMOS image sensors and Backside Illumination (BSI) CMOS image sensors are two types of CMOS image sensors. The FSI CMOS image sensors are operable to detect light projected from their front side while the BSI CMOS image sensors are operable to detect light projected from their backside. When light projected into the FSI CMOS image sensors or the BSI CMOS image sensors, photoelectrons are generated and then are sensed by light-sensing devices in pixels of the image sensors. The more the photoelectrons are generated, the more superior quantum efficiency (QE) the image sensor has, thus improving the image quality of the CMOS image sensors.

However, while CMOS image sensor technologies are rapidly developed, CMOS image sensors with higher Quantum Efficiency (QE) are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
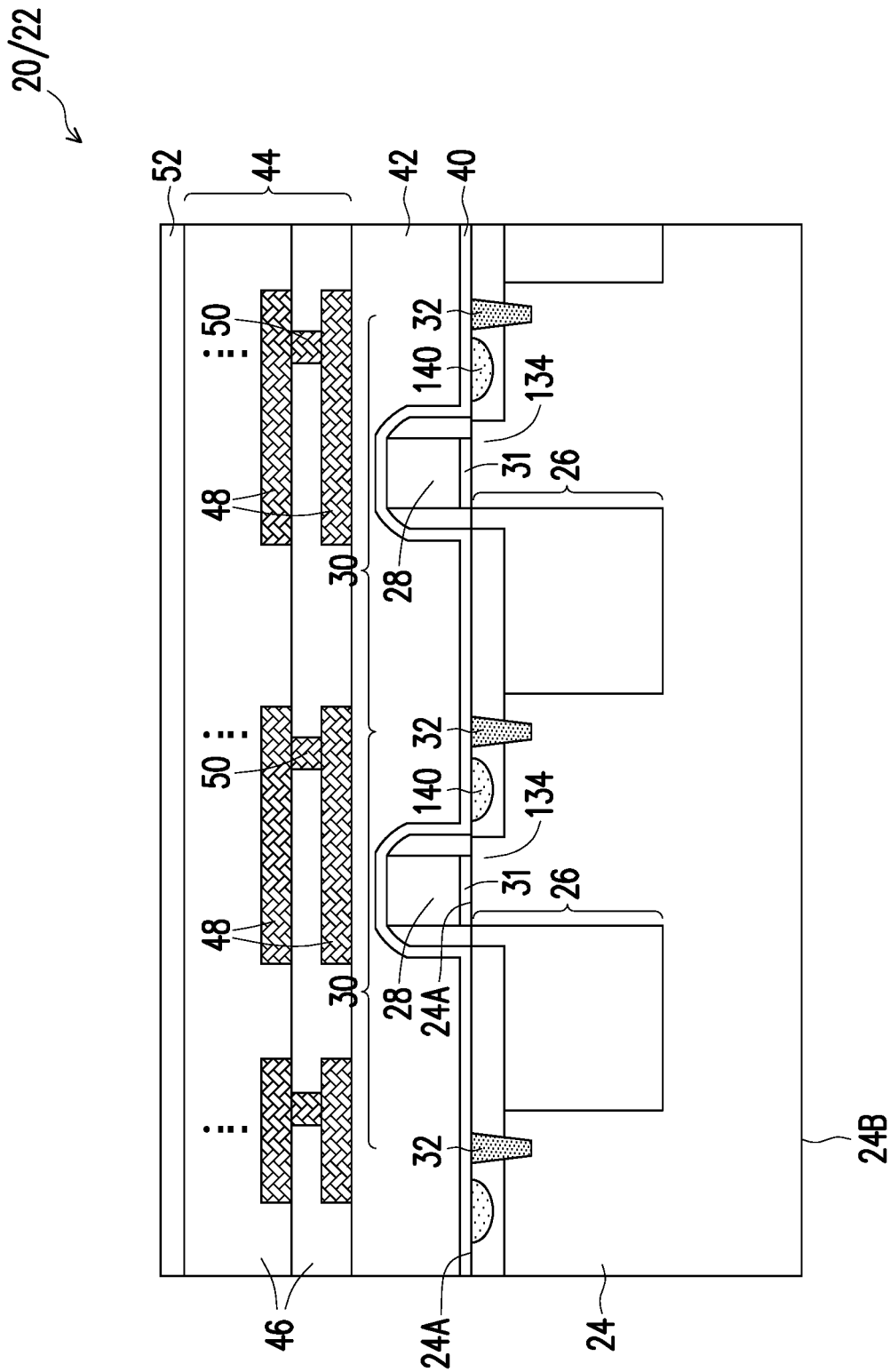
FIGS. 1 through 12 illustrate the cross-sectional views of intermediate stages in the formation of deep trench isolation regions in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Deep Trench Isolation (DTI) structure in a semiconductor substrate and the method of forming the same are provided in accordance with various embodiments. The intermediate stages of forming the D/TI structure are illustrated in accordance with some embodiments. Some variations of some embodiments are discussed. Throughout the various views and illustrative embodiments, like reference numbers are used to designate like elements. In accordance with some embodiments of the present disclosure, the DTI structure forms a grid, and includes a high-reflectivity metallic material and a void in the high-reflectivity metallic material. Accordingly, with the use of the high-reflectivity metallic material, the quantum efficiency of the image sensors is improved. On the other hand, with the void being formed, buffers are provided to absorb the stress generated in thermal cycles, which stress is due to the significant difference between the high-reflectivity metallic material and the semiconductor substrate. Accordingly, the possibility of cracking is reduced. The DTI structure may be used for Backside Illumination (BSI) Complementary Metal-Oxide-Semiconductor (CMOS) image sensors or Front Side Illumination (FSI) CMOS image sensors, and may be used in other application in which deep trench isolation regions are used.

Figure 18:
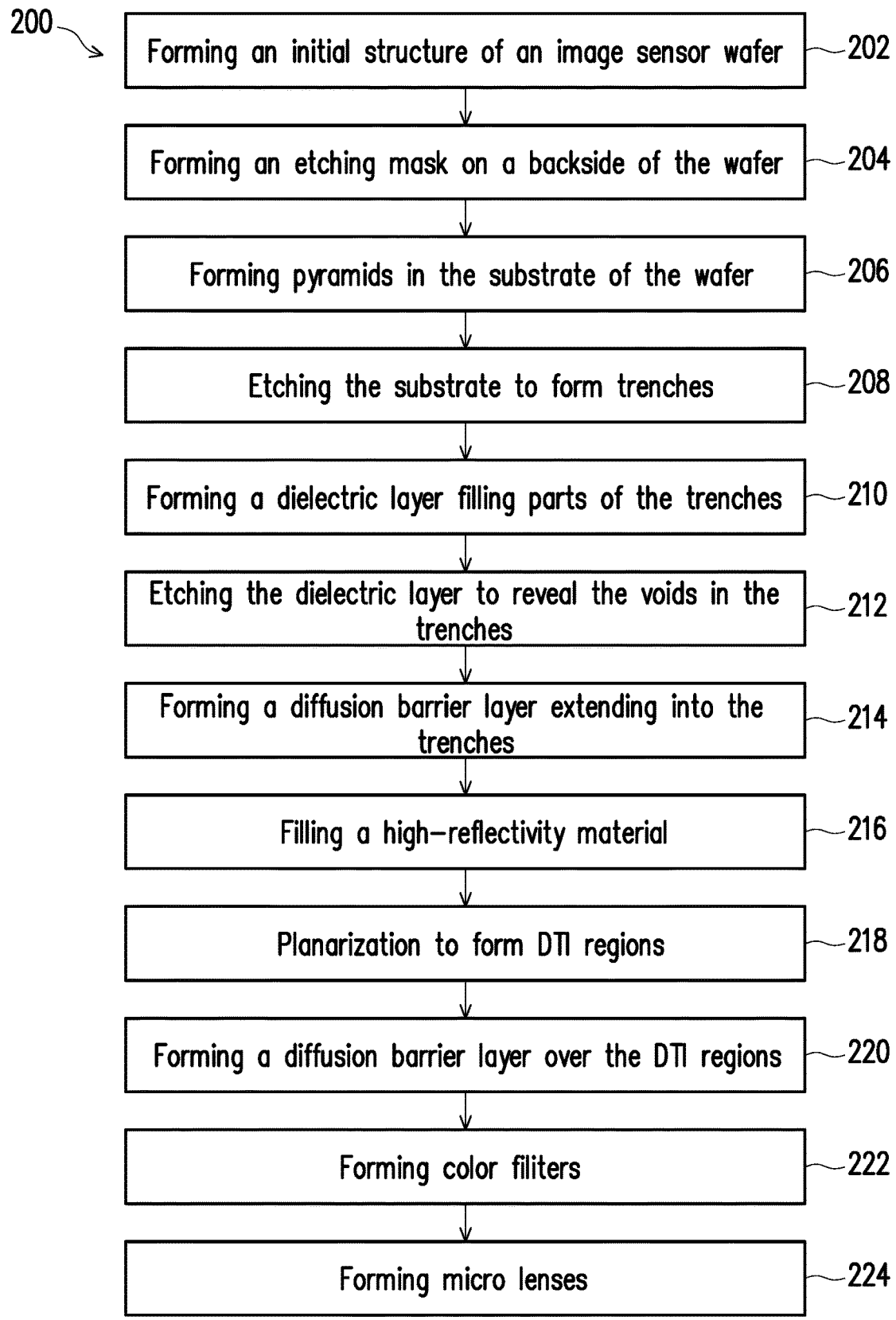
FIG. 18 illustrates a process flow for forming deep trench isolation regions in accordance with some embodiments.

FIGS. 1 through 12 illustrate the cross-sectional views of intermediate stages in the formation of a DTI structure in accordance with some embodiments of the present disclosure. The steps shown in FIGS. 1 through 12 are also reflected schematically in the process flow 200 as shown in FIG. 18. The DTI regions may be used in image sensor chips (such as FSI image sensor chips or BSI image sensor chips) in accordance with some embodiments of the present disclosure.

FIG. 1 illustrates the formation of an initial structure of image sensor chip 20, which may be a part of wafer 22 that includes a plurality of image sensor chips 20 therein. The respective process is illustrated as process 202 in the process flow shown in FIG. 18. Image sensor chip 20 includes semiconductor substrate 24. In accordance with some embodiments of the present disclosure, semiconductor substrate 24 is a crystalline silicon substrate. In accordance with other embodiments of the present disclosure, semiconductor substrate 24 includes an elementary semiconductor such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. Throughout the description, major surface 24A of substrate 24 is referred to as a front surface of semiconductor substrate 24, and surface 24B is referred to as a back surface of semiconductor substrate 24. Surfaces 24A and 24B may be on (100) or (001) surface planes.

Isolation regions 32, which are alternatively referred to as Shallow Trench Isolation (STI) regions 32, are formed to extend into semiconductor substrate 24 to define active regions for circuits. In accordance with some embodiments of the present disclosure, as shown in the top view in FIG. 14, STI regions 32 may form a grid including horizontal strip portions and vertical strip portions crossing each other.

Referring back to FIG. 1, image sensors 26 are formed extending from front surface 24A into semiconductor substrate 24. The formation of image sensors 26 may include implantations. Image sensors 26 are configured to convert light signals (photons) to electrical signals. Image sensors 26 may be photo-sensitive Metal-Oxide-Semiconductor (MOS) transistors, photo-sensitive diodes, or the like. Throughout the description, Image sensors 26 are alternatively referred to as photo diodes 26, although they may be other types of image sensors. In accordance with some embodiments of the present disclosure, photo diodes 26 form an image sensor array.

Figure 13:
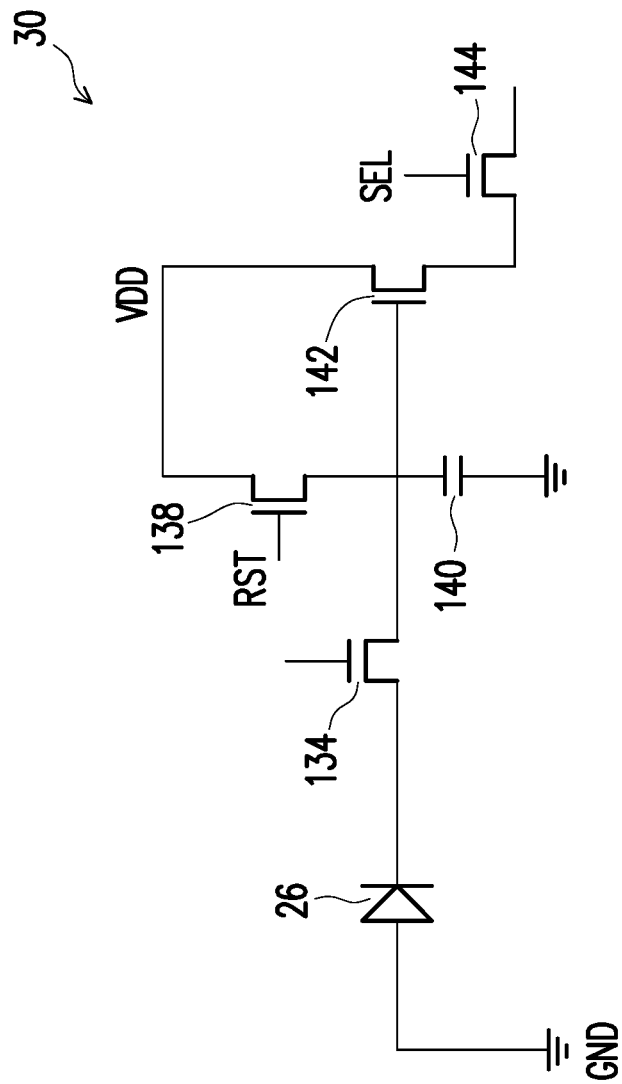
FIG. 13 illustrates a schematic of a pixel unit in accordance with some embodiments.

FIG. 1 also illustrates pixel units 30, which may include at least portions in the active regions defined by STI regions 32. FIG. 13 illustrates a circuit diagram of an example of pixel unit 30. In accordance with some embodiments of the present disclosure, pixel unit 30 includes photo diode 26, which has an anode coupled to the electrical ground GND, and a cathode coupled to a source of transfer gate transistor 134. The drain of transfer gate transistor 134 may be coupled to a drain of reset transistor 138 and a gate of source follower 142. Reset transistor 138 has a gate coupled to a reset line RST. A source of reset transistor 138 may be coupled to pixel power supply voltage VDD. Floating diffusion capacitor 140 may be coupled between the source/drain of transfer gate transistor 134 and the gate of source follower 142. Reset transistor 138 is used to preset the voltage at floating diffusion capacitor 140 to VDD. A drain of source follower 142 is coupled to a power supply voltage VDD. A source of source follower 142 is coupled to row selector 144. Source follower 142 provides a high-impedance output for pixel unit 30. The row selector 144 functions as the select transistor of the respective pixel unit 30, and the gate of the row selector 144 is coupled to select line SEL.

Referring back to FIG. 1, a transistor is illustrated as an example of the devices (such as 134, 138, 142, and 144 in FIG. 13) in pixel unit 30. For example, transfer gate transistor 134 is illustrated in FIG. 1. In accordance with some embodiments of the present disclosure, each of photo diodes 26 is electrically coupled to a first source/drain region of transfer gate transistor 134, which includes gate 28 and gate dielectric 31. Gate dielectric 31 is in contact with front surface 24A of substrate 24. The first source/drain region of transfer gate transistor 134 may be shared by the corresponding connecting photo diode 26. Floating diffusion capacitor 140 is formed in substrate 24, for example, through implanting into substrate 24 to form a p-n junction, which acts as floating diffusion capacitor 140. Floating diffusion capacitor 140 may be formed in a second source/drain region of transfer gate transistor 134, and hence one of the capacitor plates of floating diffusion capacitor 140 is electrically coupled to the second source/drain region of transfer gate transistor 134. Photo diodes 26 and the respective transfer gate transistors 134 and floating diffusion capacitors 140 in the same active region form pixel units 30 as also marked in FIG. 1.

Contact Etch Stop Layer (CESL) 40 is formed on substrate 24 and transistors such as transfer gate transistors 134. Inter-Layer dielectric (ILD) 42 is formed over CESL 40. CESL 40 may be formed of silicon oxide, silicon nitride, silicon carbo-nitride, or the like, or the multi-layers thereof. CESL 40 may be formed using a conformal deposition method such as Atomic Layer Deposition (ALD) or Chemical Vapor Deposition (CVD), for example. ILD 42 may include a dielectric material formed using, for example, Flowable Chemical Vapor Deposition (FCVD), spin-on coating, CVD, or another deposition method. ILD 42 may also be formed of an oxygen-containing dielectric material, which may be an oxide such as Tetra Ethyl Ortho Silicate (TEOS) oxide, a Plasma-Enhanced CVD (PECVD) oxide (such as $SiO_2$), Phospho-Silicate Glass (PSG), Boro-Silicate Glass (BSG), Boron-Doped Phospho-Silicate Glass (BPSG), or the like.

Front-side interconnect structure 44 is formed over semiconductor substrate 24. Front-side interconnect structure 44 is used to electrically interconnect the devices in image sensor chip 20. Front-side interconnect structure 44 includes dielectric layers 46, and metal lines 48 and vias 50 in dielectric layers 46. Throughout the description, the metal lines 48 in a same dielectric layer 46 are collectively referred to as being a metal layer. Front-side interconnect structure 44 may include a plurality of metal layers. In accordance with some embodiments of the present disclosure, dielectric layers 46 include low-k dielectric layers. The low-k dielectric layers have low k values, for example, lower than about 3.0. One or more passivation layer 52 is formed over dielectric layers 46. Passivation layers 52 may be formed of non-low-k dielectric materials having k values equal to or greater than about 3.8. In accordance with some embodiments of the present disclosure, passivation layers 52 include a silicon oxide layer and a silicon nitride layer on the silicon oxide layer.

Figure 2:
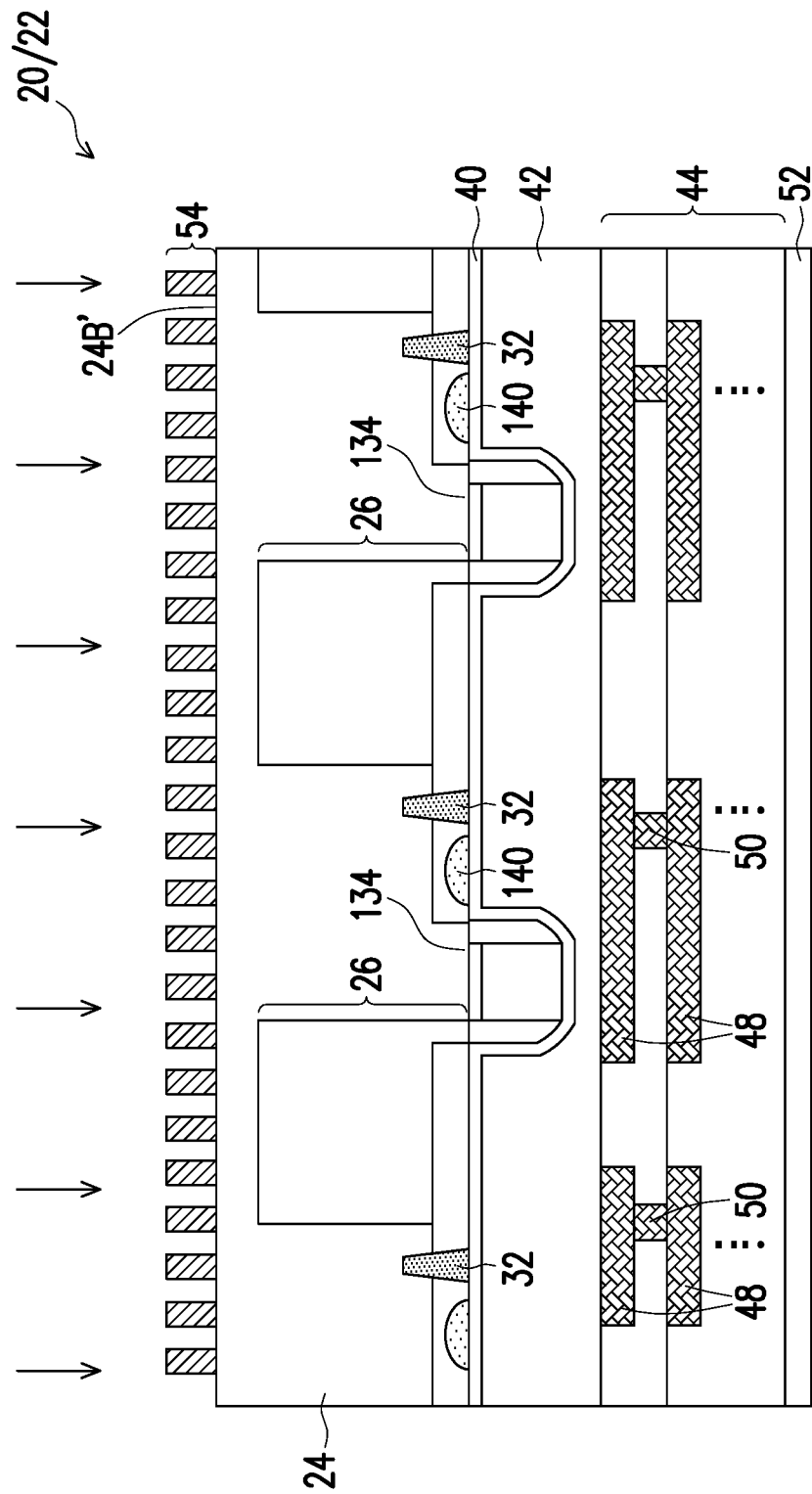

Referring to FIG. 2, wafer 22 is flipped upside down. A backside grinding is performed to grind back surface 24B (FIG. 1) to thin semiconductor substrate 24. The resulting back surface is referred to as 24B' in FIG. 2. The thickness of substrate 24 may be reduced to smaller than about 10 μm, or smaller than about 5 μm, for example. With semiconductor substrate 24 having a small thickness, light can penetrate from back surface 24B' into semiconductor substrate 24, and reach photo diodes 26.

In accordance with some embodiments of the present disclosure, etching mask 54 is formed on the back surface 24B' of semiconductor substrate 24. The respective process is illustrated as process 204 in the process flow shown in FIG. 18. In accordance with some embodiments of the present disclosure, etching mask 54 includes a hard mask, which may be formed of silicon nitride, titanium nitride, or the like. A pad layer (not shown) may also be formed underlying the hard mask. The pad layer may be a thin film comprising silicon oxide formed, for example, using a thermal oxidation process or a deposition process such as Chemical Vapor Deposition (CVD). The pad layer may buffer the stress of the hard mask. In accordance with some embodiments of the present disclosure, hard mask 54 is formed of silicon nitride, for example, using Low-Pressure Chemical Vapor Deposition (LPCVD). In accordance with other embodiments, hard mask 54 is formed using thermal nitridation of silicon, Plasma Enhanced Chemical Vapor Deposition (PECVD), or the like. A photo resist (not shown) may be formed on hard mask 54 and then patterned, and hard mask 54 is patterned using the photo resist as an etching mask. In a top view of the structure shown in FIG. 2, the patterned etching mask 54 may include a plurality of discrete blocks arranged as an array, and the spaces between the discrete blocks form a grid.

Figure 3:
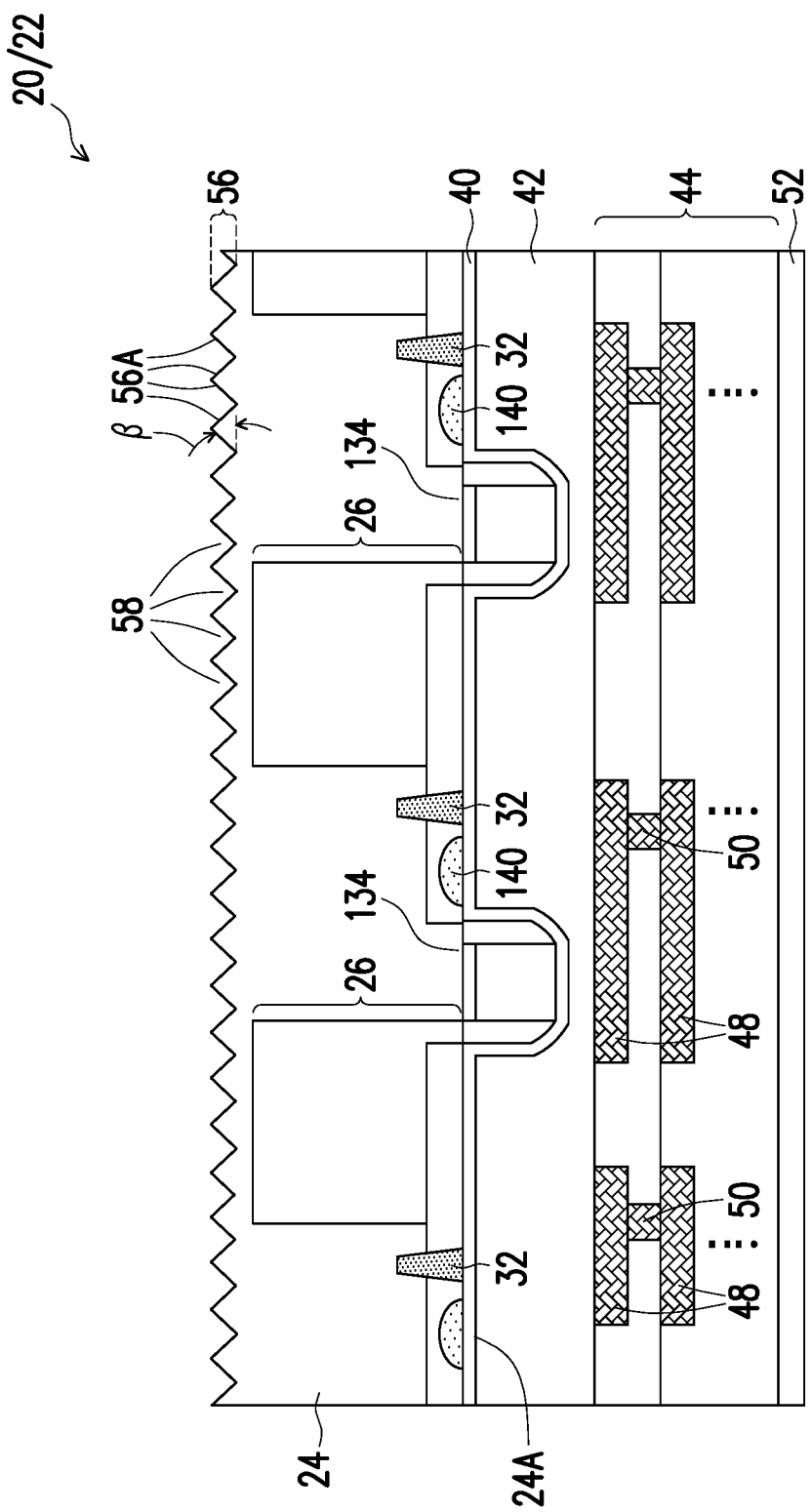
Figure 4:
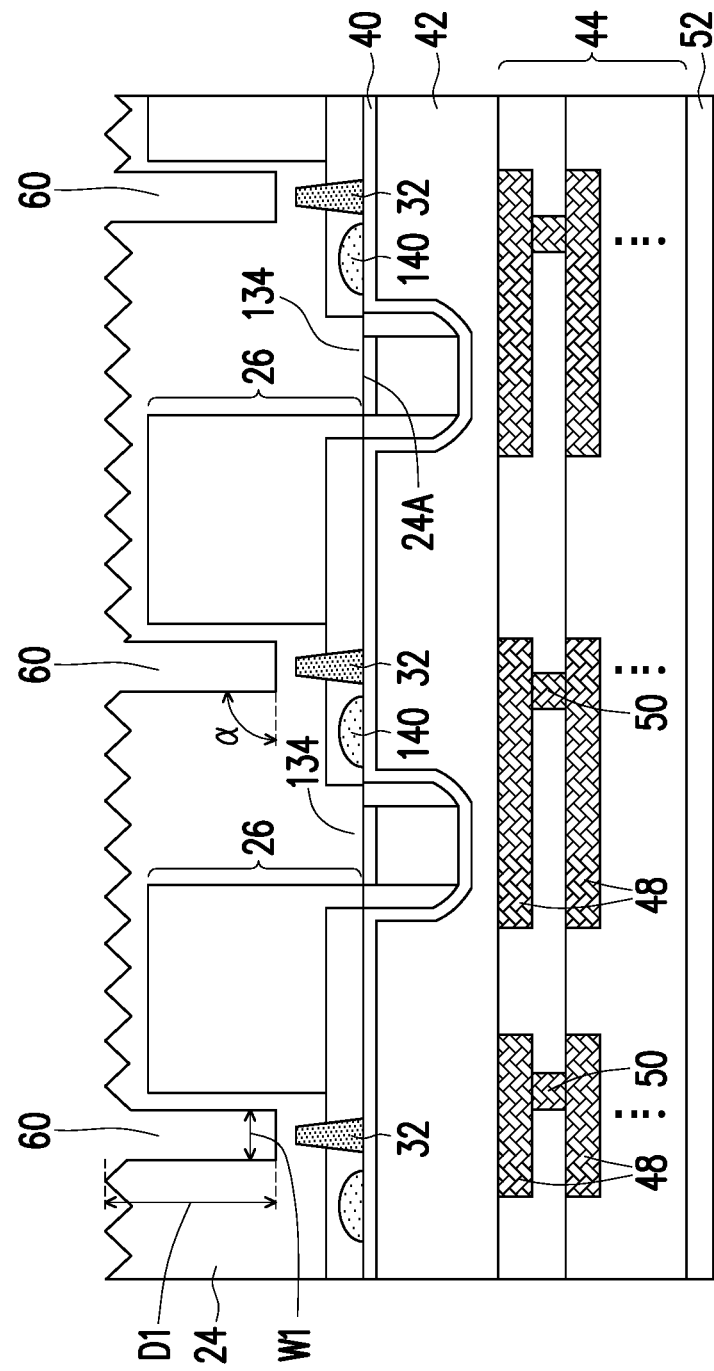

Next, an etching process is performed to form the structure shown in FIG. 3. The respective process is illustrated as process 206 in the process flow shown in FIG. 18. The etching process may include a wet etching process, which may be performed using KOH, Tetra Methyl Ammonium Hydroxide (TMAH), or the like as an etchant. Since the etching rates of semiconductor substrate 24 on different surface planes are different from each other, slant straight surfaces 56A are formed, for example, on (111) surface planes, which have tilt angle β equal to about 54.7 degrees. Recesses 58 are formed to extend into semiconductor substrate 24.

With the proceeding of the etching of semiconductor substrate 24, straight surfaces 56A are recessed, and opposite surfaces 56A facing the same recess 58 eventually meet with each other to have a V-shape. In accordance with some embodiments of the present disclosure, etching mask 54 is removed after recesses 58 start extending directly underlying etching mask 54, followed by another wet etching to further extend recesses 58 down until the top portions of semiconductor substrate 24 form pyramids. In accordance with other embodiments, etching mask 54 is consumed during the wet etching so that a single wet etching process may result in the structure as shown in FIG. 3. In accordance with some embodiments of the present disclosure, etching mask 54 is removed when recesses 58 start extending directly underlying etching mask 54, and no more etching of substrate 24 is performed after etching mask 54 is removed.

After the etching, pyramids 56 are formed, with each of pyramids including four sides. Each of the four sides has a triangular shape. In accordance with other embodiments, instead of having pyramid shapes, pseudo pyramids are formed, which include small planar platforms at the top, which planar platforms are formed since the portions of substrate 24 directly underlying etching mask 54 are not fully etched. Accordingly, the resulting structure will have a trapezoidal cross-sectional view shape. In subsequent discussion, pyramids are used as examples, and other shapes of the top portions of substrate 24 are contemplated. When viewed from top, pyramids (or pseudo pyramids) may form an array.

Next, an etching process is performed to form trenches 60. The respective process is illustrated as process 208 in the process flow shown in FIG. 18. The etching is performed through an anisotropic etching process, so that the sidewalls of trenches 60 are straight and vertical, wherein the sidewalls are perpendicular to major surface 24A of substrate 24. Trenches 60 may also be slightly tapered, and hence the sidewalls of trench 60 are substantially perpendicular to (and slightly tilted) major surface 24A of substrate 24. For example, the angle α may be greater than about 88 degrees and smaller than 90 degrees. In accordance with some embodiments of the present disclosure, the etching is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as $SF_6$, $CF_4$, $CHF_3$, $NF_3$), Chlorine-containing gases (such as $Cl_2$), $Br_2$, HBr, $BCl_3$, and/or the like. When viewed from top of wafer 22, trenches 60 form a grid. Furthermore, trenches 60 may overlap STI regions 32, which also form a grid. Trenches 60 may be spaced apart from the respective underlying STI regions 32 by a small distance, for example, smaller than about 0.5 μm.

In accordance with some embodiments of the present disclosure, depth D1 of trenches 60 is in the range between about 1 μm and about 10 μm. Width W1 of trenches 60 may be in the range between about 0.1 μm and about 0.3 μm. Aspect ratio D1/W1 of trench 60 may be greater than about 5, or greater than about 10 or higher, for example, between about 10 and 20. In accordance with some embodiments of the present disclosure, the bottom surfaces of trenches 60 are rounded and have a U-shape or a V-shape in the cross-sectional view.

Figure 5:
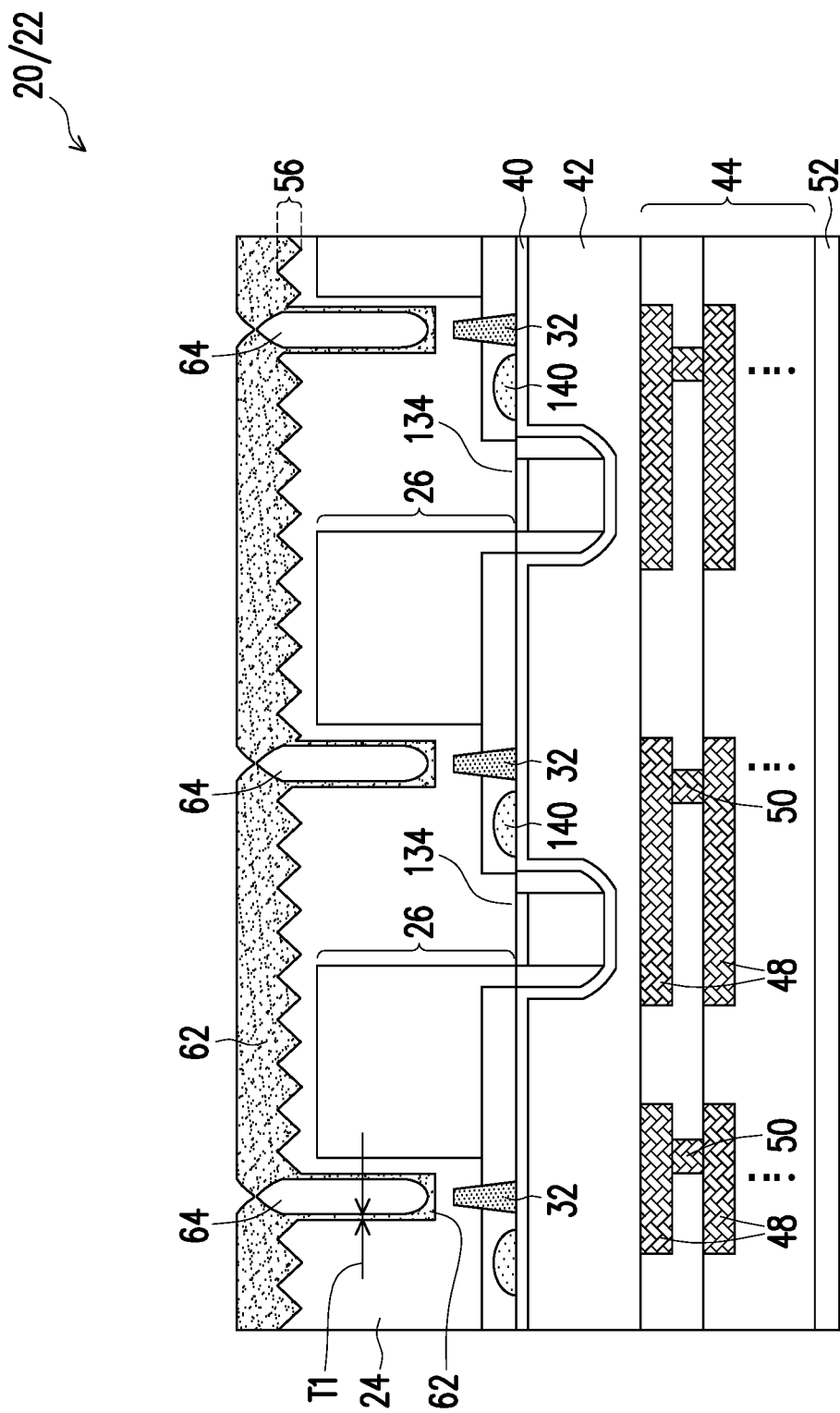

FIG. 5 illustrates the formation of dielectric layer 62. The respective process is illustrated as process 210 in the process flow shown in FIG. 18. In accordance with some embodiments of the present disclosure, dielectric layer 62 comprises silicon oxide. The formation of dielectric layer 62 may be achieved through a non-conformal and none bottom-up deposition method, so that recesses 58 (FIG. 4) are fully filled. Voids (air gaps) 64 are formed in trenches 60, and are sealed by dielectric layer 62. For example, dielectric layer 62 may be formed using High-Density Plasma (HDP) Chemical Vapor Deposition (CVD). The top ends of voids 64 may be higher than the top ends of pyramids 56 in accordance with some embodiments. The thickness T1 of the sidewall portions of dielectric layer 62 in trenches 60 may be in the range between about 10 Å and about 200 Å, wherein thickness T1 may be measured at a level in the middle between the bottom of trenches 60 and the top of pyramids 56. In accordance with some embodiments of the present disclosure, a planarization process such as a Chemical Mechanical Polish (CMP) process or a mechanical grinding process is performed. In accordance with alternative embodiments of the present disclosure, no planarization process is performed on dielectric layer 62.

Figure 6:
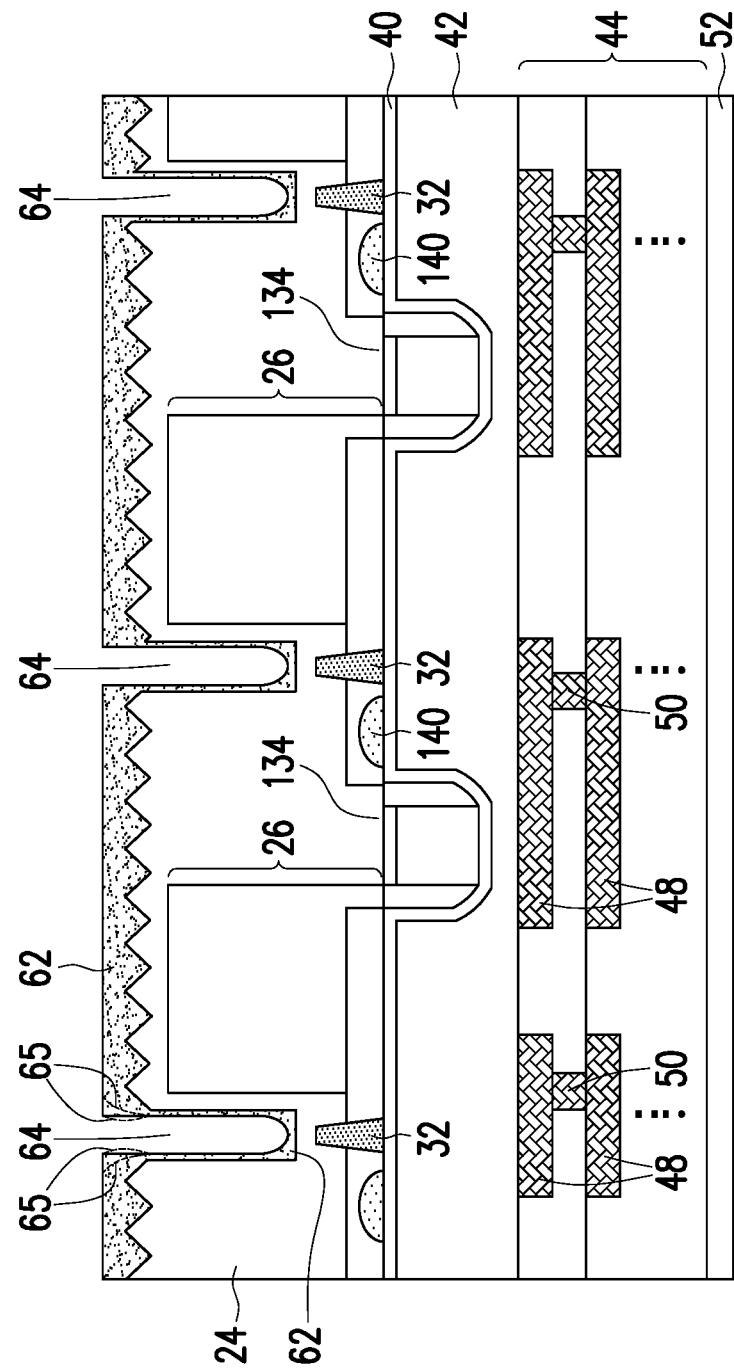

FIG. 6 illustrates the opening of dielectric layer 62 in order to expose voids 64. The respective process is illustrated as process 212 in the process flow shown in FIG. 18. In accordance with some embodiments of the present disclosure, the opening process includes a dry etch or a wet etch process. For example, when dry etch is used, a mixed gas of $NF_3$ and $NH_3$ or a mixed gas of HF and $NH_3$ may be used. When wet etch is used, an HF solution may be used. The etch may be performed without any hard mask, and all top surfaces of dielectric layer 62 are exposed to the etchant. Since the portions of dielectric layer 62 directly overlying voids 64 are thinner than the portions directly over pyramids 56, although the etching is performed without an etching mask, voids 64 are exposed, while some other portions of dielectric layer 62 remain to cover pyramids 56. In accordance with some embodiments of the present disclosure, voids 64 have curved edges at top, wherein dashed lines 65 are drawn to show the possible shapes. The subsequently formed layers 66 and 68 thus will follow the profile of dashed lines 65. In accordance with alternative embodiments of the present disclosure, an etching mask (not shown) such as a patterned photo resist is used, wherein the patterned etching mask have some portions overlapping pyramids 56, and have openings overlapping voids 64. Dielectric layer 62 is etched using the etching mask to open voids 64.

Figure 7:
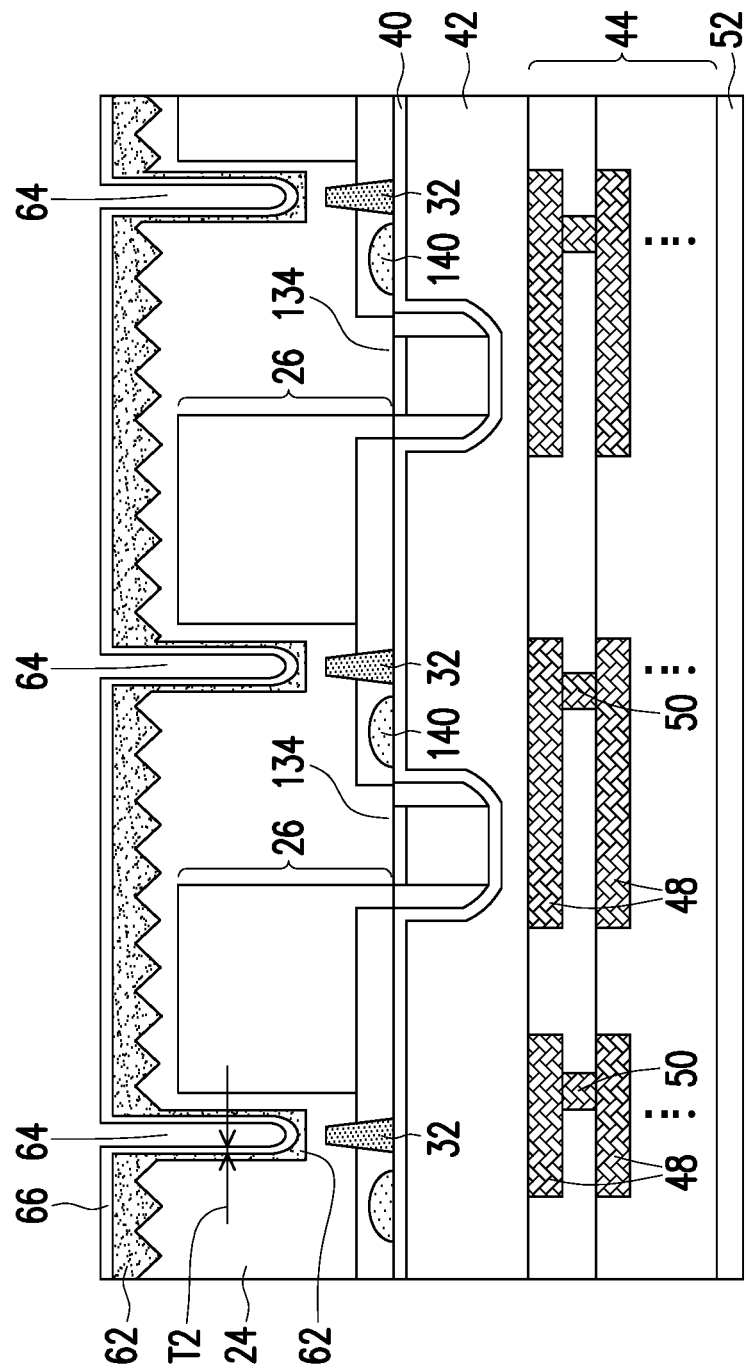

FIG. 7 illustrates the formation of diffusion barrier layer 66. The respective process is illustrated as process 214 in the process flow shown in FIG. 18. In accordance with some embodiments of the present disclosure, diffusion barrier layer 66 is formed of a material that can effectively prevent the subsequently deposited high-reflectivity layer 68 (FIG. 9) from diffusing into substrate 24. Furthermore, diffusion barrier layer 66 may also be formed of a high-k dielectric layer because some of the high-k dielectric materials have advantageously optical properties (such as good reflection property). Non-high-k materials with good optical properties are also contemplated by the embodiments. In accordance with some embodiments of the present disclosure, diffusion barrier layer 66 is formed of aluminum oxide ($Al_2O_3$), hafnium oxide ($HfO_2$), tantalum oxide ($Ta_2O_5$), or the like, or a composite layer including more than one of these layers. The formation of diffusion barrier layer 66 may be achieved using a conformal deposition method such as Atomic Layer Deposition (ALD), CVD, or the like. The thickness of diffusion barrier layer 66 is high enough to prevent the subsequently deposited high-reflectivity layer 68 (FIG. 9) from diffusing into substrate 24, yet small enough to leave enough space for high-reflectivity layer 68 and voids 64. For example, thickness T2 of diffusion barrier layer 66 is greater than about 30 Å because if thickness T2 is smaller, the diffusion-preventing ability of diffusion barrier layer 66 is inadequate. On the other hand, thickness T2 may be smaller than about 10 percent of width W1 of trenches 60. Otherwise, the remaining voids 64 will be too small and will not have enough height. The thickness T2 of diffusion barrier layer 66 may be in the range between about 30 Å and about 100 Å. Thickness T2 may also be measured at a level in the middle between the bottom of trenches 6o and the top of pyramids 56.

Figure 8:
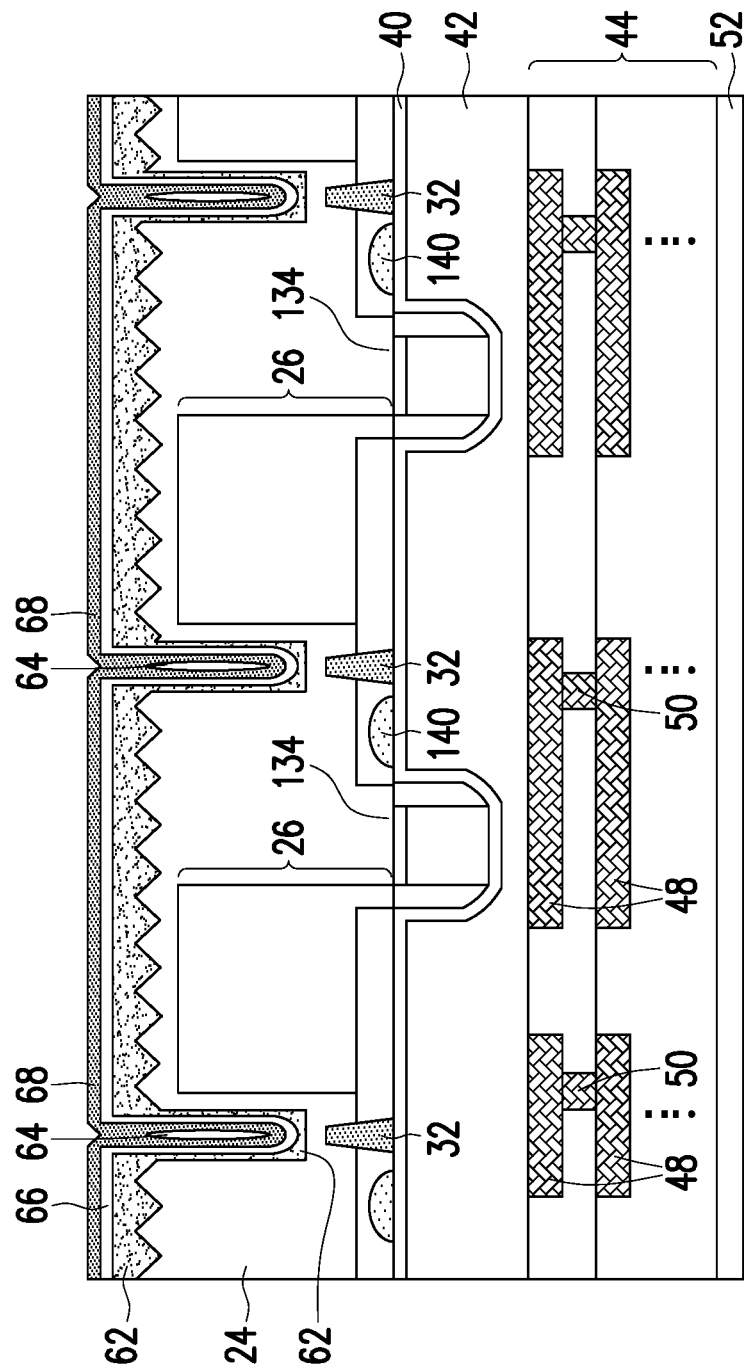
Figure 16:
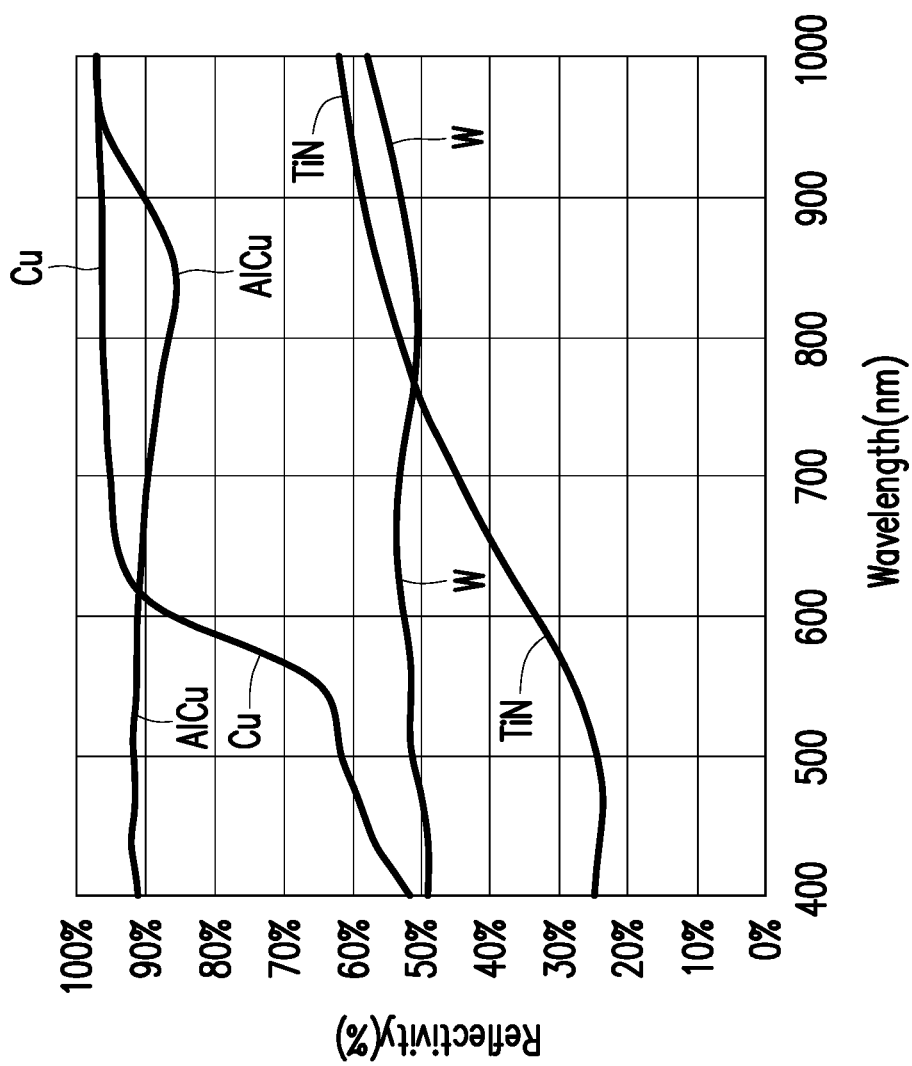
FIG. 16 illustrates the reflectivity values of some metals as a function of wavelength in accordance with some embodiments.
Figure 17:
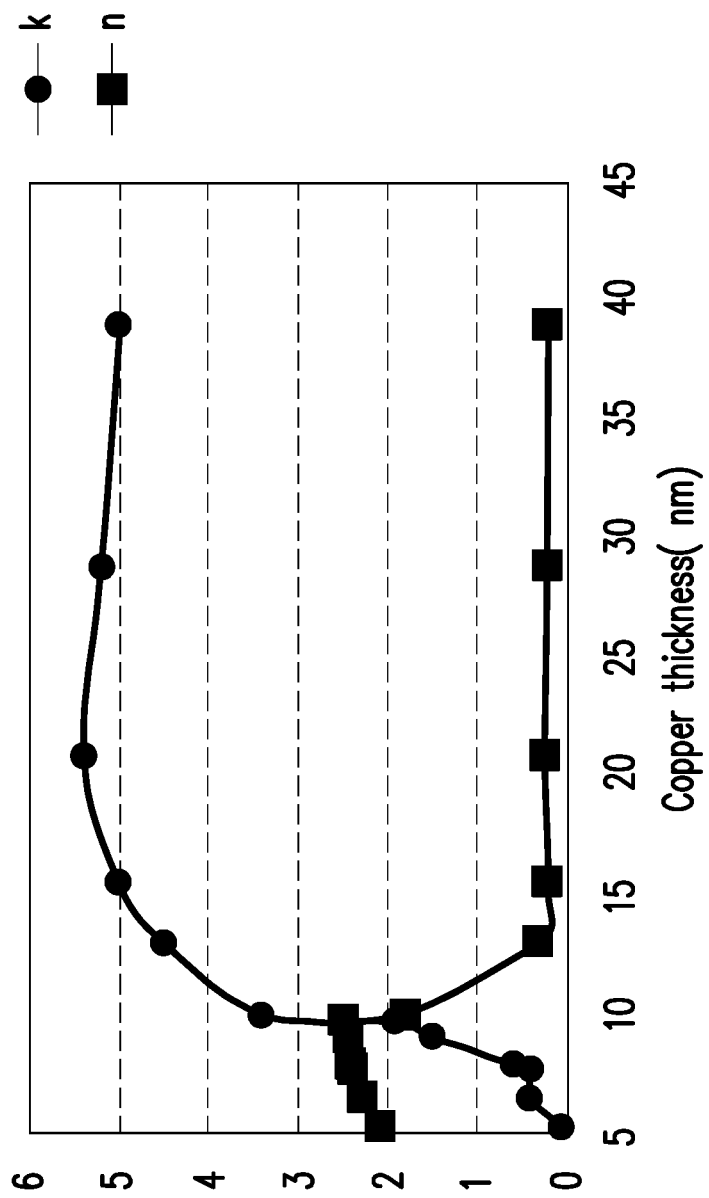
FIG. 17 illustrates the absorption index and reflective index of copper as a function of the thickness of copper in accordance with some embodiments.

FIG. 8 illustrates the formation of high-reflectivity layer 68. The respective process is illustrated as process 216 in the process flow shown in FIG. 18. In accordance with some embodiments of the present disclosure, the formation method includes forming a seed layer (for example, using PVD), and plating high-reflectivity layer 68. The seed layer may be formed of copper. The material of high-reflectivity layer 68 includes a material that has a high reflectivity, for example, higher than about 90 percent at a wavelength greater than about 600 nm. FIG. 16 illustrates the reflectivity values of several metal-containing materials (with thicknesses being 5 kÅ) as a function of wavelengths. As is shown in FIG. 16, copper and aluminum copper (AlCu) have high reflectivity values, and can be used to form high-reflectivity layer 68. As a comparison, tungsten and titanium nitride have low reflectivity values, and will not be used. Also, FIG. 17 illustrates the absorption index k and reflective index n of copper as functions of the thicknesses of copper in accordance with some embodiments. The results shown in FIG. 17 were obtained using the light with wavelength of 940 nm. FIG. 17 illustrates that when the thickness of copper layer is about 15 nm (150 Å) or greater, the absorption index k is high, for example, with values being about 5.0 or higher. The absorption index k also becomes stably high when the thicknesses of copper are greater than about 150 Å. High absorption index means that the light goes into copper is absorbed more, and will not penetrate through copper to go into neighboring image sensor cells, and will not adversely affect the neighboring image sensor cells. FIG. 17 also illustrates that when the thickness of copper layer is about 150 Å or greater, the reflective index n is low. The reflective index n also becomes stably low with thicknesses of copper being greater than about 150 Å. Low reflective index n means that light-reflection at the surface of copper is better. Also, when the thickness of copper is increased to about 300 Å or greater, the absorption index k and reflective index n of copper are satisfactory for all wavelengths.

Based on the results shown in FIG. 17, the thickness of high-reflectivity layer 68 is greater than about 150 Å, and may be greater than about 300 Å for performance demanding devices. The thickness of high-reflectivity layer 68 is also small enough so that the remaining voids 64 are large enough, and the top ends of voids 64 can be at least level with or higher than the top ends of substrate 24, so that the ability of voids 64 for absorbing stress is not compromised. In accordance with some embodiments of the present disclosure, thickness T3 of high-reflectivity layer 68 (FIG. 8) may be in the range between about 150 Å and about 500 Å, and may be in the range between about 300 Å and about 500 Å. Thickness T3 may also be measured at a level in the middle between the bottom of trenches 60 and the top of pyramids 56. Also, all portions of high-reflectivity layer 68 may have thicknesses greater than about 150 Å or greater than about 300 Å.

In order to form high-reflectivity layer 68 while leaving voids 64 not fully filled, a method capable of increasing the overhang of high-reflectivity layer 68 is used, wherein the overhang portions are the portions that are directly over some portions of voids 64. The overhangs of high-reflectivity layer 68 grow toward each other, and eventually seal voids 64 therein. In accordance with some embodiments of the present disclosure, high-reflectivity layer 68 is plated, with the plating including two stages. The first stage is performed using a first plating current small enough so that the respective plated first layer of high-reflectivity layer 68 is substantially conformal. Accordingly, the plated first layer has a good coverage. When the thickness of the first layer of high-reflectivity layer 68 is greater than about 150 Å (for example, for copper), the second stage is performed, and a second plating current higher than the first plating current is used to increase the deposition rate and to form a second layer on the first layer. The deposition rate in the second stage is high so that the top portions of metal layer 68, especially the portions outside and around the top ends of trenches 60 are grown much faster than the portions inside trenches 60. Accordingly, voids 64 are sealed. In accordance with some embodiments of the present disclosure, the first plating current of the first plating stage has a first current in the range between about 0.5 amps and about 5 amps, and the second plating current has a second current in the range between about 10 amps and about 40 amps. It is appreciated that the plating currents are related to the total area to be plated. In accordance with some embodiments of the present disclosure, the ratio of the second current to the first current (and the corresponding current densities) is greater than 1.0, greater than about 2.0, and may be in the range between about 2 and about 80.

Figure 9:
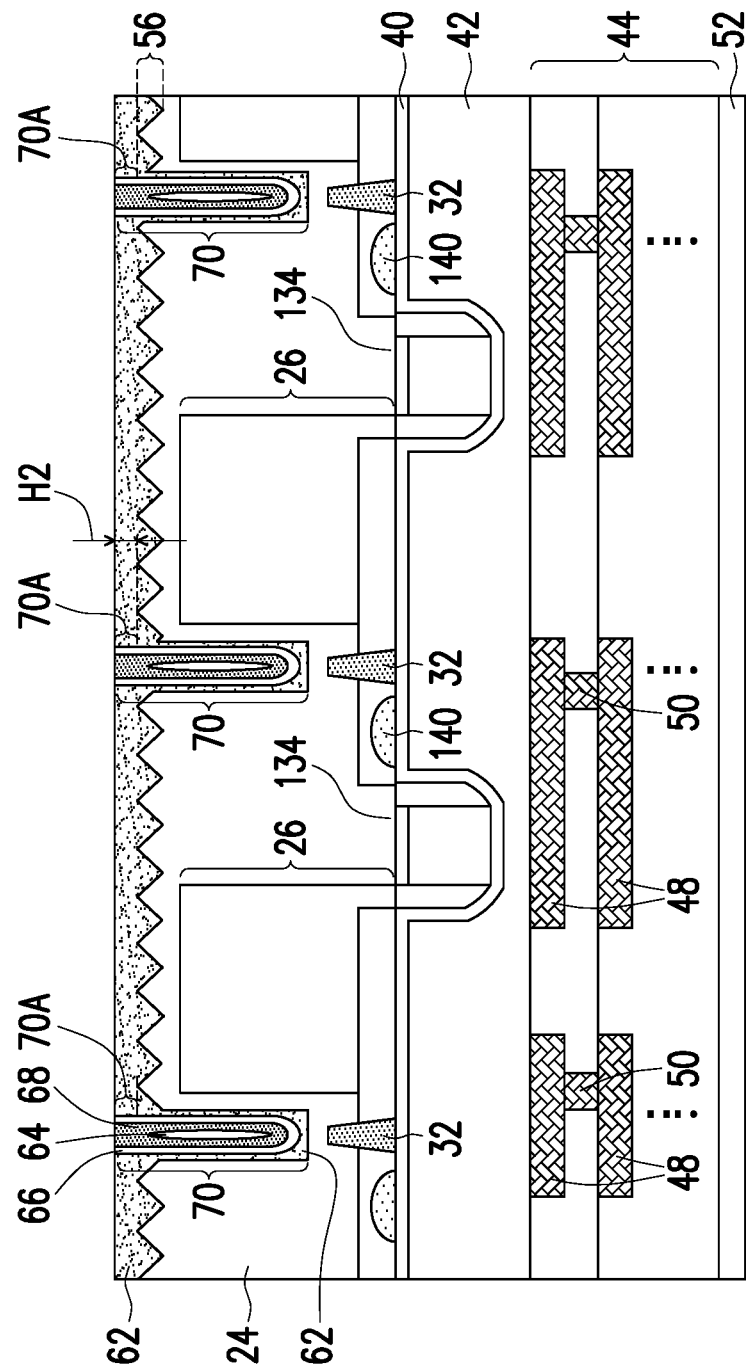

Referring to FIG. 9, a planarization process such as a CMP process or a mechanical grinding process is performed to remove excess portions of layers 62, 66, and 68, forming Deep Trench Isolations (DTIs) 70. The respective process is illustrated as process 218 in the process flow shown in FIG. 18. The remaining voids 64 in DTI regions 70 have top ends level with or higher than the bottoms of pyramids 56, for example, at the level between the top ends and the bottoms of pyramids 56 in order to effectively absorb stress. The top ends of voids 64 may also be higher than the top ends of pyramids 56 to have further improved ability in absorbing the stress. Furthermore, DTI regions 70 include portions 70A higher than the top ends of pyramids 56. Portions 70A do not have void therein. The portions of metal layer 68 in portions 70A also form a grid when viewing from the top of wafer 22. These portions of metal layer 68 thus act as a metal grid. In accordance with some embodiments of the present disclosure, height H2 of portions 70A is greater than about 0.5 μm to effectively confine incoming light between the grids.

Figure 10:
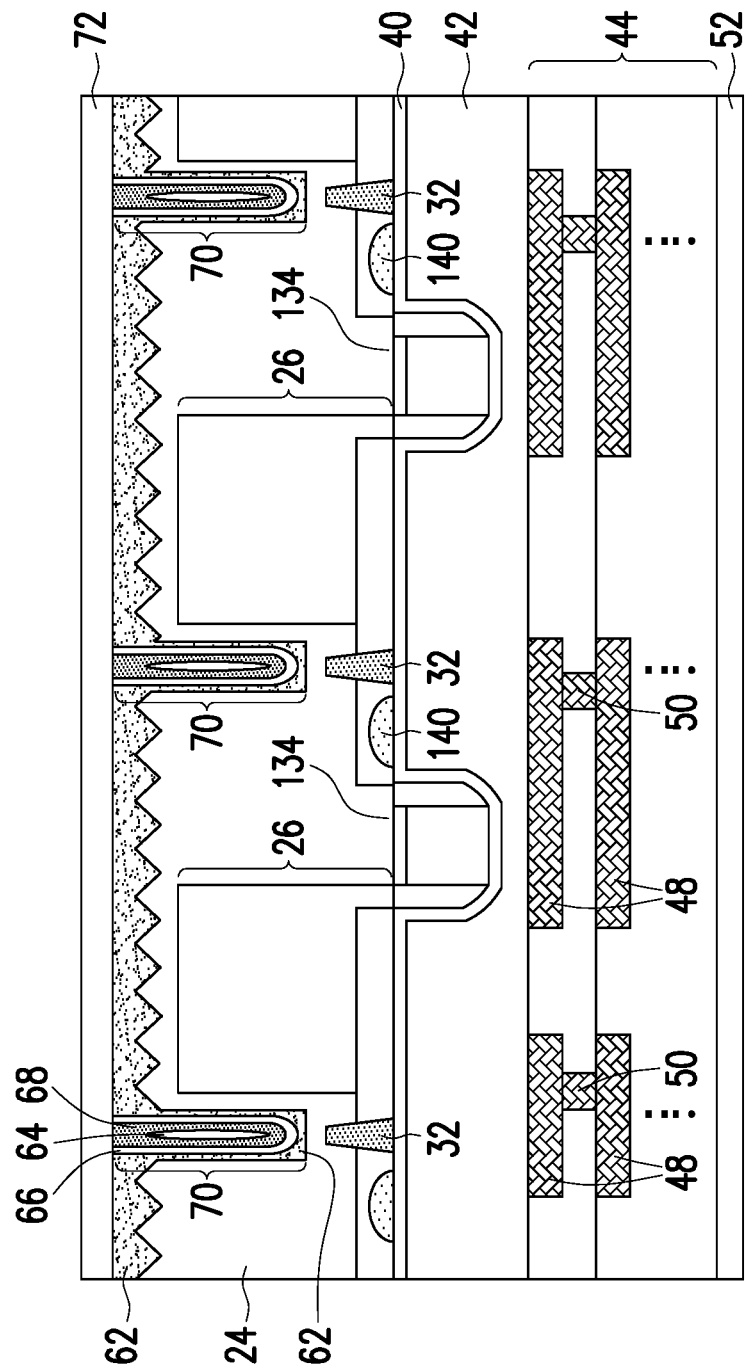

FIG. 10 illustrates the deposition of diffusion barrier layer 72. The respective process is illustrated as process 220 in the process flow shown in FIG. 18. In accordance with some embodiments of the present disclosure, diffusion barrier layer 72 comprises silicon nitride or the like. Diffusion barrier layer 72 prevents the material (such as copper) in DTI regions 70 from being diffused upwardly.

Figure 14:
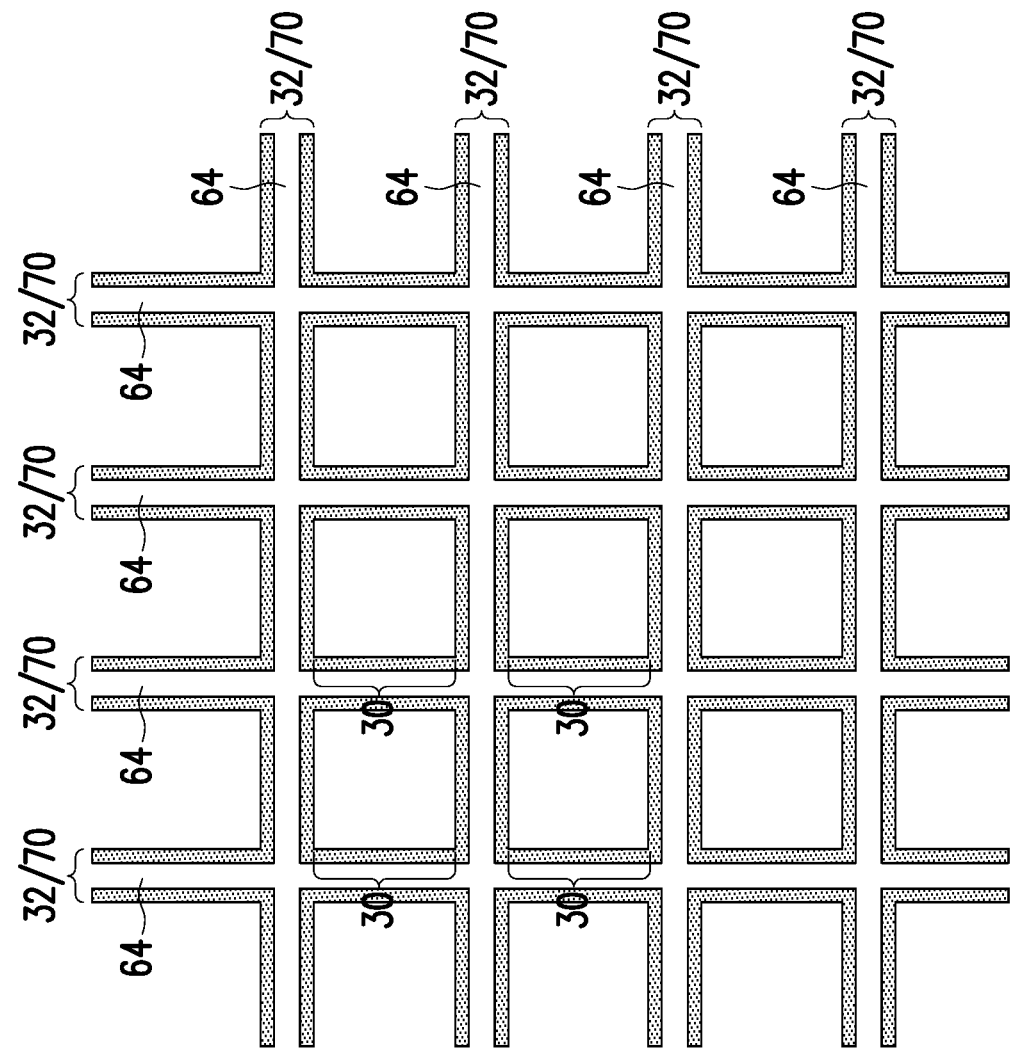
FIG. 14 illustrates a top view of deep trench isolation structures in accordance with some embodiments.

FIG. 14 illustrates a top view of DTI regions 70. In accordance with some embodiments of the present disclosure, a plurality of DTI regions 70 are formed simultaneously, each having the structure shown in FIG. 10. The plurality of DTI regions 70 form a plurality of strips as shown in FIG. 14, which include a first plurality of strips 70 extending in the X-direction, and a second plurality of strips 70 extending in the Y-direction, which is perpendicular to the X-direction. Hence, the first plurality of DTI regions 70 and the second plurality of DTI regions 70 form a grid pattern, with a plurality of portions of semiconductor substrate 24 separated from each other, and defined by, the grid. The grid of DTI regions 70 overlap the grid formed of STI regions 32.

Voids 64, as also illustrated in FIG. 14, may include portions extending in the X-direction and portions extending in the Y-direction. The portions of voids 64 extending in the X-direction and the Y-direction are also interconnected to form an integrated void, which has the shape of a grid when viewed from top.

Figure 11:
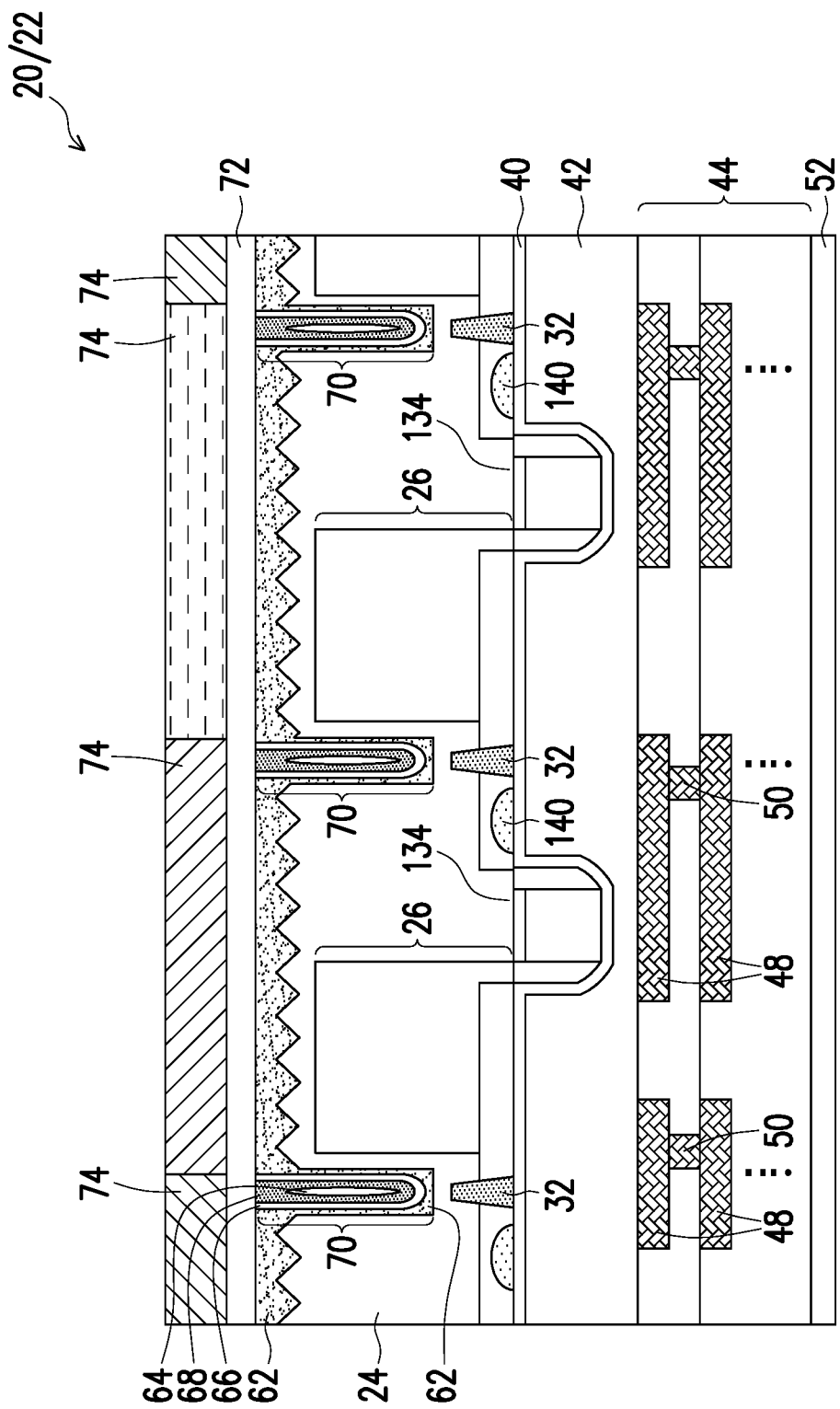
Figure 12:
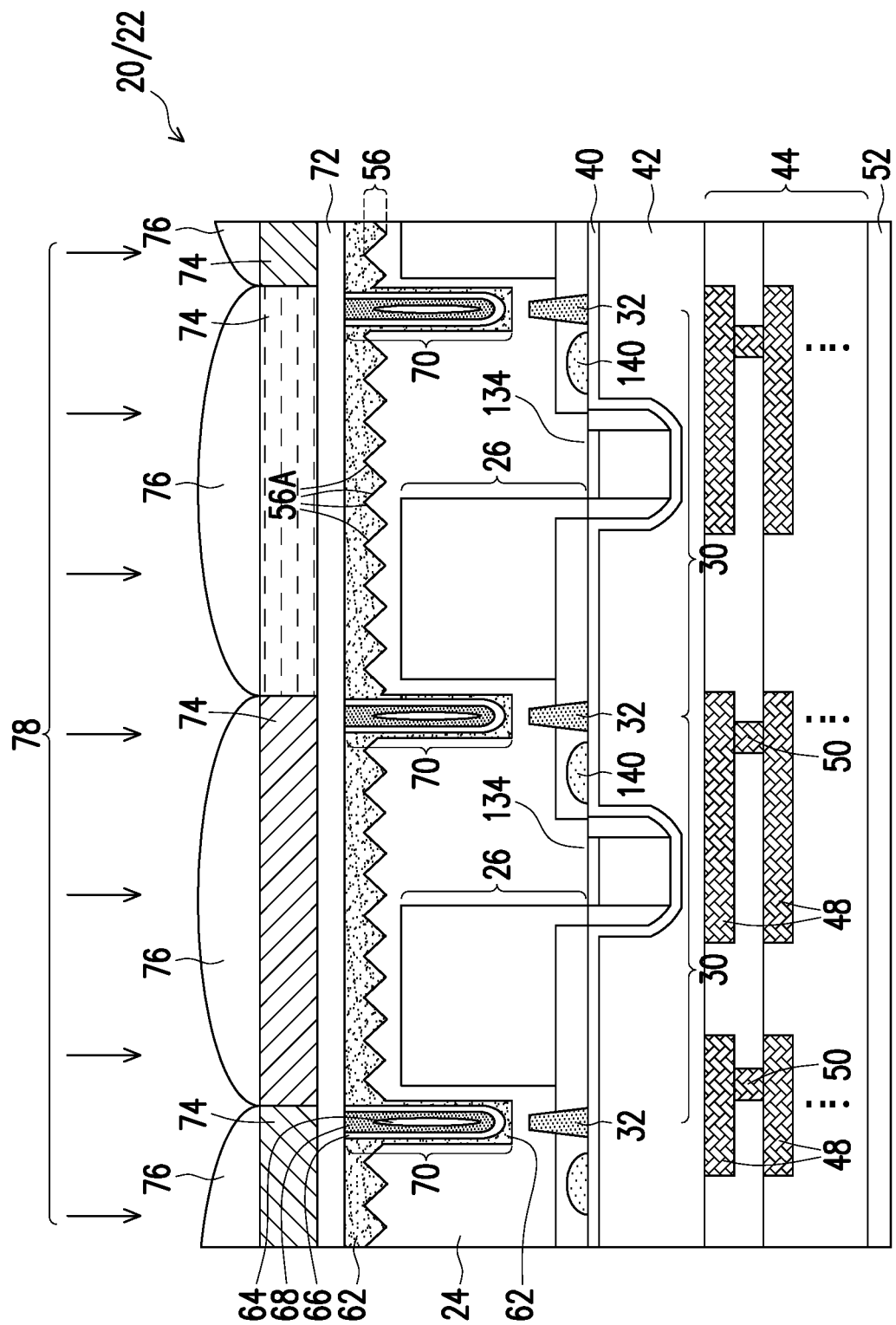

In subsequent process steps, as shown in FIG. 11, additional components such as color filters 74 are formed. The respective process is illustrated as process 222 in the process flow shown in FIG. 18. Micro lenses 76 are then formed, as shown in FIG. 12. The respective process is illustrated as process 224 in the process flow shown in FIG. 18. Each of image sensors 26 is aligned to one of color filters 74 and one of micro-lenses 76. Image sensor chip 20 (and corresponding wafer 22) is thus formed.

The image sensor chip 20 as shown in FIG. 12 is a BSI image sensor chip, and incoming light 78 is projected from the backside of substrate 24 onto image sensors 26. The light 78 may be scattered by slanted surfaces 56A, so that the light becomes more tilted inside substrate 24. The tilted light is more likely to be reflected (rather than penetrating through substrate 24). Also, by forming high-reflectivity layer 68 using a high-reflectivity material, the light is more likely to be reflected than absorbed by DTIs 70. These factors increase the light-traveling paths in substrate 24 (and in image sensors 26), and the light has more chance to be absorbed by image sensors 26. The light-conversion efficiency (the quantum efficiency) is thus improved.

Figure 15:
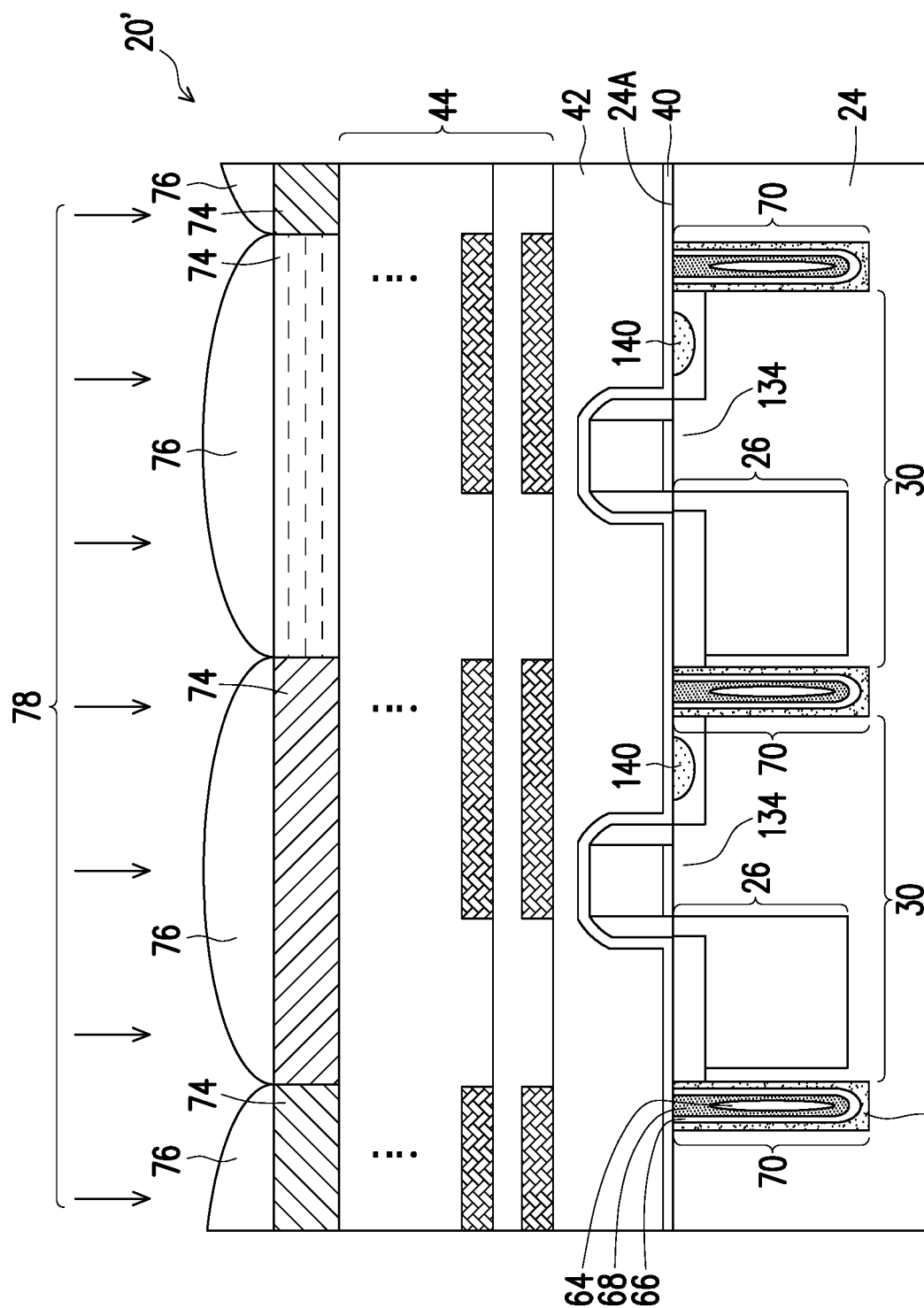
FIG. 15 illustrates a cross-sectional view of a Front-Side Illumination (FSI) image sensor chip in accordance with some embodiments.

The DTI regions 70 formed in accordance with some embodiments of the present disclosure may also be used in other structures such as in Front Side Illumination (FSI) image sensor chips. FIG. 15 illustrates an embodiment in which DTI regions 70 are formed in FSI image sensor chip 20'. Referring to FIG. 15, FSI image sensor chip 20' includes DTI regions 70, which form a grid similar to what is shown in FIG. 14. Pixel units 30 have portions formed in the regions defined by DTI regions 70. In accordance with some embodiments of the present disclosure, STI regions are no longer formed to define active regions since DTI regions 70 include dielectric layers that may also act as (electrical) isolation regions. Each of the pixel units 30 may include photo diode 26, transfer gate transistor 134, and additional components (not shown in FIG. 15, refer to FIG. 13). DTI regions 70 extend from the major surface 24A (which is the front surface) of semiconductor substrate 24 into an intermediate level of semiconductor substrate 24. Interconnect structure 44 may be formed over pixel units 30 and DTI regions 70, and includes a plurality of metal lines and vias in a plurality of dielectric layers. Color filters 74 and micro lenses 76 are formed over interconnect structure 44, and are aligned to pixel units 30. In the FSI image sensor chip 20', light 78 is projected to photo diodes 26 from the front surface of chip 20'.

A plurality of group of samples are made on semiconductor wafers to compare the results. The first group of samples is formed to have air gaps (which are not filled) as DTI regions. The second group of samples is formed to have tungsten in DTI regions. The third group of samples is formed according to some embodiments of the present disclosure, in which copper is used. The first, the second, and the third groups have the same number of pixels. After the formation, the three groups of samples are measured to determine the number of defective pixels and the quantum efficiency of the image sensors. The number of Dark Current (DC) pixels in the first, second, and the third groups of sample pixels are 17, 44, and 18, respectively. This indicates the number of DC pixels in accordance with some embodiments of the present disclosure (the third group) is much better than that of the second group, and is substantially the same as that of the first group. The number of White Pixels (WP) in the first, second, and the third groups of sample pixels are 522, 1145, and 438, respectively, indicating the number of DC pixels formed in accordance with some embodiments of the present disclosure (the third group) is much better than that of both the first and the second groups. In addition, the quantum efficiency of the samples formed in accordance with some embodiments of the present disclosure (the third group) is 19 percent, which is slightly lower than the 24 percent quantum efficiency of the first group of samples, and much higher than the 5 percent quantum efficiency of the second group of samples. Accordingly, the samples formed in accordance with some embodiments of the present disclosure have the best overall performance.

The embodiments of the present disclosure have some advantageous features. By using a high-reflectivity metallic material such as copper to form DTI regions, the quantum efficiency of image sensors is improved. The high-reflectivity metallic material, however, may have a Coefficient of Thermal Expansion (CTE) around 16 to 16.7, which is much greater than the CTE (about 3 to 5) of the substrate. The significant difference in the CTEs causes cracks to be formed between the DTI regions and the substrate. This problem is solved by forming voids (air gaps) in the DTI regions. The voids act as the buffer for the increased volume of copper under elevated temperatures, and absorb the stress generated due to thermal cycles. Accordingly, the performance of the image sensors is improved without sacrificing the reliability.

In accordance with some embodiments of the present disclosure, a method includes etching a semiconductor substrate to form a trench; filling a dielectric layer into the trench, with a void being formed in the trench and between opposite portions of the dielectric layer; etching the dielectric layer to reveal the void; forming a diffusion barrier layer on the dielectric layer; and forming a high-reflectivity metal layer on the diffusion barrier layer, wherein the high-reflectivity metal layer comprises a portion extending into the trench, and a remaining portion of the void is enclosed by the high-reflectivity metal layer. In an embodiment, the forming the high-reflectivity metal layer comprises: forming a seed layer extending into the trench; plating a first copper-containing metal layer to a thickness greater than about 150 Å on the seed layer, wherein the first copper-containing metal layer is plated using a first plating current; and depositing a second copper-containing metal layer on the first copper-containing metal layer, wherein the second copper-containing metal layer is plated using a second plating current greater than the first plating current. In an embodiment, the forming the diffusion barrier layer comprises depositing a conformal high-k dielectric layer. In an embodiment, the method further includes, before the semiconductor substrate is etched to form the trench, etching the semiconductor substrate to form an array of pyramids, with the pyramids formed of portions of the semiconductor substrate. In an embodiment, the method further includes planarizing the high-reflectivity metal layer, the diffusion barrier layer, and the dielectric layer to form a DTI region, wherein after the high-reflectivity metal layer is planarized, the void is sealed in the high-reflectivity metal layer. In an embodiment, the DTI region forms a grid, and the method further comprises: forming pixel units, with portions of the pixel units in the grid; and forming color filters and micro lenses overlapping the grid. In an embodiment, a portion of the void extends beyond the semiconductor substrate. In an embodiment, the forming the diffusion barrier layer comprises depositing hafnium oxide or aluminum oxide.

In accordance with some embodiments of the present disclosure, a method includes forming STI regions extending from a first surface of a semiconductor substrate into the semiconductor substrate; forming pixel units between the STI regions; forming DTI regions extending from a second surface of a semiconductor substrate toward the STI regions, wherein the forming the DTI regions comprises: etching the semiconductor substrate to form trenches extending from the second surface of the semiconductor substrate into the semiconductor substrate; forming a dielectric layer extending into the trenches; filling a high-reflectivity metal layer extending into the trenches and over the dielectric layer, wherein the high-reflectivity metal layer encloses a void therein; and planarizing the high-reflectivity metal layer and the dielectric layer to form the DTI regions; and forming micro lenses aligned to the pixel units. In an embodiment, the DTI regions comprise portions extending beyond the second surface of the semiconductor substrate, with the portions of the DTI regions being located between the semiconductor substrate and the micro lenses. In an embodiment, the method further includes, before the etching the semiconductor substrate to form the trenches, etching the semiconductor substrate from the second surface to form pyramids. In an embodiment, the dielectric layer further comprises a portion between the semiconductor substrate and the micro lenses. In an embodiment, the method further includes forming a first diffusion barrier layer between the dielectric layer and the high-reflectivity metal layer; and forming a second diffusion barrier layer between the semiconductor substrate and the micro lenses. In an embodiment, the filling the high-reflectivity metal layer comprises: plating using a first plating current to form a substantially conformal layer; and plating using a second plating current greater than the first plating current to seal the void.

In accordance with some embodiments of the present disclosure, a structure includes a DTI region extending from a top surface of a semiconductor substrate into the semiconductor substrate, wherein the DTI region comprises a dielectric layer extending into the semiconductor substrate; and a high-reflectivity metal layer between opposite portions of the dielectric layer, wherein the high-reflectivity metal layer encloses a void therein; a diffusion barrier layer over the DTI regions and the semiconductor substrate; pixel units with portions in the semiconductor substrate; color filters overlapping the pixel units; and micro lenses overlapping the color filters. In an embodiment, the structure further comprises a Shallow Trench Isolation (STI) region extending from a bottom surface of the semiconductor substrate into the semiconductor substrate, wherein the DTI region overlaps the STI region. In an embodiment, the structure further comprises a diffusion barrier layer between the semiconductor substrate and the color filters, wherein the dielectric layer comprises a portion overlapping the semiconductor substrate, with the portion of the dielectric layer having opposite surfaces contacting the semiconductor substrate and the diffusion barrier layer. In an embodiment, the structure further comprises an additional diffusion barrier layer between the dielectric layer and the high-reflectivity metal layer, wherein the additional diffusion barrier layer is in the semiconductor substrate. In an embodiment, the high-reflectivity metal layer has a reflectivity higher than about 90 percent. In an embodiment, all portions of the high-reflectivity metal layer in the DTI region have thicknesses greater than about 150 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor substrate to form a trench extending from a top surface of the semiconductor substrate into the semiconductor substrate;
   filling a dielectric layer into the trench, with a void being formed in the trench and between opposite portions of the dielectric layer;
   after the dielectric layer is filled, etching the dielectric layer to reveal the void, wherein after the etching the dielectric layer, a remaining portion of the dielectric layer is overlying the top surface;
   forming a diffusion barrier layer on the dielectric layer;
   forming a high-reflectivity layer on the diffusion barrier layer, wherein the high-reflectivity layer comprises a portion extending into the trench, and a remaining portion of the void is enclosed by the high-reflectivity layer; and removing portions of the high-reflectivity layer, wherein the removed portions of the high-reflectivity layer overlap image sensors in the semiconductor substrate.

2. The method of claim 1, wherein the forming the high-reflectivity layer comprises:
    forming a seed layer extending into the trench;
    plating a first copper-containing metal layer to a thickness greater than about 150 Å on the seed layer, wherein the first copper-containing metal layer is plated using a first plating current; and
    depositing a second copper-containing metal layer on the first copper-containing metal layer, wherein the second copper-containing metal layer is plated using a second plating current greater than the first plating current.

3. The method of claim 1, wherein the remaining portion of the void enclosed by the high-reflectivity layer forms a void grid that comprises a first plurality of parallel voids and a second plurality of parallel voids joining the first plurality of parallel voids, and wherein the first plurality of parallel voids are perpendicular to the second plurality of parallel voids.

4. The method of claim 1, wherein before the dielectric layer is etched to reveal the void, the void is sealed by the dielectric layer.

5. The method of claim 1, wherein the removing the portions of the high-reflectivity layer comprises planarizing the high-reflectivity layer, the diffusion barrier layer, and the dielectric layer to form a Deep Trench Isolation (DTI) region, wherein after the high-reflectivity layer is planarized, the void is sealed in the high-reflectivity layer.

6. The method of claim 5, wherein the high-reflectivity layer comprises copper.

7. The method of claim 1, wherein a portion of the void extends beyond the semiconductor substrate.

8. The method of claim 1, wherein the etching the dielectric layer is performed without using etching mask to cover any portion of the dielectric layer.

9. A method comprising:
    forming Shallow Trench Isolation (STI) regions extending from a first surface of a semiconductor substrate into the semiconductor substrate;
    forming pixel units between the STI regions;
    forming Deep Trench Isolation (DTI) regions extending from a second surface of the semiconductor substrate toward the STI regions, wherein the forming the DTI regions comprises:
        etching the semiconductor substrate to form trenches extending from the second surface of the semiconductor substrate into the semiconductor substrate;
        forming a dielectric layer extending into the trenches;
        performing an etching process to remove first portions of the dielectric layer in the trenches, wherein second portions of the dielectric layer overlapping the semiconductor substrate remain after the etching process;
        filling a high-reflectivity metal layer extending into the trenches and over the dielectric layer, wherein the high-reflectivity metal layer encloses a void therein; and
        planarizing the high-reflectivity metal layer and the dielectric layer to form the DTI regions, wherein some portions of the high-reflectivity metal layer directly over the pixel units are removed by the planarizing; and
    forming micro lenses aligned to the pixel units.

10. The method of claim 9, wherein the void enclosed by the high-reflectivity metal layer forms a void grid that comprises a first plurality of parallel voids and a second plurality of parallel voids joining the first plurality of parallel voids, and wherein the first plurality of parallel voids are perpendicular to the second plurality of parallel voids.

11. The method of claim 9 further comprising, before the etching the semiconductor substrate to form the trenches, etching the semiconductor substrate from the second surface to form pyramids, wherein the void has a top end higher than top tips of the pyramids.

12. The method of claim 9, wherein the etching process is performed without using any etching mask.

13. The method of claim 9 further comprising:
    forming a first diffusion barrier layer between the dielectric layer and the high-reflectivity metal layer; and
    forming a second diffusion barrier layer between the semiconductor substrate and the micro lenses.

14. The method of claim 9, wherein the filling the high-reflectivity metal layer comprises:
    plating using a first plating current to form a substantially conformal layer; and
    plating using a second plating current greater than the first plating current to seal the void.

15. A method comprising:
    forming a Deep Trench Isolation (DTI) grid extending into a semiconductor substrate, wherein the DTI grid comprises:
        a void grid; and
        a metallic material enclosing the void grid therein, wherein the metallic material has a grid pattern;
    depositing a dielectric layer over the semiconductor substrate;
    forming color filters over the dielectric layer, wherein the color filters are vertically aligned to grid openings of the DTI grid; and
    forming micro lenses over the color filters, wherein the micro lenses are aligned to the color filters, wherein the micro lenses are vertically offset from the metallic material.

16. The method of claim 15, wherein the forming the DTI grid comprises:
    depositing an additional dielectric layer extending into the semiconductor substrate;
    depositing the metallic material on the additional dielectric layer; and
    removing some portions of the metallic material, wherein the micro lenses are directly over where the removed portions of the metallic material were located.

17. The method of claim 16 further comprising, after the additional dielectric layer is deposited, and before the metallic material is deposited, depositing a diffusion barrier layer.

18. The method of claim 15 further comprising forming the void grid comprising:
    etching the semiconductor substrate to form a trench grid;
    depositing a non-conformal dielectric layer to partially fill the trench grid and to form the void grid; and
    etching the non-conformal dielectric layer to re-expose the void grid, wherein the metallic material is formed to re-seal the void grid.

19. The method of claim 18, wherein the etching the non-conformal dielectric layer is performed without forming an etching mask to cover any portion of the non-conformal dielectric layer.

20. The method of claim 15, wherein the void grid comprises:

a first plurality of void strips extending in a first direction; and a second plurality of void strips extending in a second direction, wherein the first plurality of void strips are joined with the second plurality of void strips.

* * * * *